(12) United States Patent
Hashimoto et al.

(10) Patent No.: US 8,148,995 B2
(45) Date of Patent: Apr. 3, 2012

(54) DEGRADATION DETERMINATION DEVICE FOR HEATER OF GAS SENSOR AND METHOD FOR DIAGNOSING THE HEATER

(75) Inventors: Ikuro Hashimoto, Chiryu (JP); Masayuki Kita, Kariya (JP)

(73) Assignee: Denso Corporation, Kariya (JP)

( * ) Notice: Subject to any disclaimer, the term of this patent is extended or adjusted under 35 U.S.C. 154(b) by 405 days.

(21) Appl. No.: 12/409,762

(22) Filed: Mar. 24, 2009

(65) Prior Publication Data
US 2009/0278548 A1 Nov. 12, 2009

(30) Foreign Application Priority Data
May 7, 2008 (JP) ................................ 2008-121587

(51) Int. Cl.
*G01R 31/28* (2006.01)
(52) U.S. Cl. ........................................................ 324/511
(58) Field of Classification Search .................. None
See application file for complete search history.

(56) References Cited

U.S. PATENT DOCUMENTS

| | | | | |
|---|---|---|---|---|
| 4,644,266 A | * | 2/1987 | Reuter .......................... | 324/73.1 |
| 5,228,426 A | * | 7/1993 | Pursifull et al. .............. | 123/690 |
| 5,245,979 A | * | 9/1993 | Pursifull et al. .............. | 123/690 |
| 6,164,125 A | | 12/2000 | Kawase et al. | |
| 6,294,075 B1 | * | 9/2001 | Poggio et al. ................. | 123/697 |
| 6,696,673 B2 | * | 2/2004 | Okamoto ....................... | 123/697 |
| 7,779,626 B2 | * | 8/2010 | Ohsaki ........................... | 60/320 |
| 7,980,121 B2 | * | 7/2011 | Matsuoka et al. .......... | 73/114.69 |
| 2002/0017285 A1 | * | 2/2002 | Okamoto ....................... | 123/685 |
| 2006/0117737 A1 | * | 6/2006 | Ohsaki ........................... | 60/276 |
| 2009/0056414 A1 | * | 3/2009 | Matsuoka et al. ........... | 73/23.32 |
| 2009/0139212 A1 | * | 6/2009 | Miwa ............................. | 60/277 |
| 2010/0269805 A1 | * | 10/2010 | Fukuda et al. ................ | 123/690 |

FOREIGN PATENT DOCUMENTS

| | | |
|---|---|---|
| JP | 4-134063 | 12/1992 |
| JP | 6-331498 | 12/1994 |
| JP | 8-110320 | 4/1996 |

OTHER PUBLICATIONS

Office Action (2 pgs.) mailed Sep. 8, 2011 issued in corresponding Japanese Application No. 2008-121587 with an at least partial English-language translation thereof (2 pgs.).

* cited by examiner

*Primary Examiner* — Jermele M Hollington
(74) *Attorney, Agent, or Firm* — Nixon & Vanderhye P.C.

(57) ABSTRACT

A sensor element detects exhaust gas emitted from an internal combustion engine. A heater is supplied with electricity from a power source so as to heat the sensor element. A detection unit detects heater voltage across the heater. A degradation determination unit determines whether the heater is degraded in accordance with at least one of the heater voltage and a diagnosis value, which changes according to the heater voltage. The degradation determination unit determines whether the heater is degraded further in accordance with at least one of power-supply voltage of the power source and a driving state of an electric device, which is supplied with electricity from the power source.

14 Claims, 5 Drawing Sheets

DEGRADATION DETERMINATION DEVICE FOR HEATER OF GAS SENSOR AND METHOD FOR DIAGNOSING THE HEATER

CROSS REFERENCE TO RELATED APPLICATIONS

This application is based on and incorporates herein by reference Japanese Patent Application No. 2008-121587 filed on May 7, 2008.

FIELD OF THE INVENTION

The present invention relates to a degradation determination device for diagnosing a heater, which is provided for heating a sensor element of a gas sensor. The present invention further relates to a method for diagnosing the heater.

BACKGROUND OF THE INVENTION

Conventionally, an internal combustion engine is provided with a gas sensor such as an A/F sensor, an O2 sensor, which detects oxygen concentration, a NOx sensor, which detects nitrogen oxide concentration, and the like. In such an internal combustion engine, for example, fuel injection quantity is controlled based on a detection signal of the gas sensor so as to reduce emission contained in exhaust gas of the engine. Such a gas sensor is provided with a heater for heating a sensor element so as to activate the sensor element in a starting operation of the internal combustion engine, for example. The heater is configured to quickly activate the sensor element so as to enhance reduction in emission in the starting operation of the engine. In such a gas sensor, failure such as short circuit of both wiring ends of the heater, disconnection of the heater, and the like may arise in a circuit for supplying electricity to the heater. For example, U.S. Pat. No. 6,164,125 (JP-A-11-6812) discloses a gas sensor system, which determines the short circuit and the disconnection. Specifically, in the gas sensor system, when monitoring voltage between both wiring ends of the heater is lower than a threshold VTHα (FIG. 4), it is determined that disconnection arises. Alternatively, when the monitoring voltage is higher than a threshold VTHβ (FIG. 4), it is determined that short circuit arises. In recent years, reduction of emission is increasingly demand. Therefore, detection of degradation caused by aging of the heater is also demanded in addition to detection of the short circuit and the disconnection of the heater.

SUMMARY OF THE INVENTION

In view of the foregoing and other problems, it is an object of the present invention to produce a degradation determination device for diagnosing a heater, which is provided for heating a sensor element of a gas sensor, with high accuracy. It is another object of the present invention to produce a method for diagnosing the heater.

The present inventors noted that monitoring voltage between both wiring ends of a heater, i.e., voltage across the heater decreases when the heater is degraded. Therefore, the present inventors conceived to set a threshold VTHα (FIG. 4), which is used for determination whether disconnection arises in the heater, at a value slightly lower than a monitoring voltage when the heater is not degraded for performing the degradation determination of the heater using the threshold VTHα. However, the present inventors found the following problem. The monitoring voltage between both wiring ends of the heater, i.e., voltage across the heater changes in accordance with change in power supply voltage of a battery (power source), which supplies electricity to the heater. In addition, decrease in monitoring voltage, which is caused by degradation of the heater, is slight compared with decrease in monitoring voltage caused by disconnection of the heater. Therefore, when the threshold for the degradation determination of the heater is merely set at a value, which is slightly lower than the monitoring voltage in a normal condition in which the heater is not degraded, the heater may be erroneously determination to be degraded in a case where the monitoring voltage decreases due to fall in power supply voltage of the battery. Alternatively, when the threshold for the degradation determination is set at a value, which is significantly lower than the monitoring voltage in the normal condition, the heater may be erroneously determined to be normal in a case where the monitoring voltage increases due to rise in power supply voltage of the battery.

According to one aspect of the present invention, a degradation determination device for diagnosing a heater, which is configured to be supplied with electricity from a power source so as to heat a sensor element, which is for detecting exhaust gas emitted from an internal combustion engine, the degradation determination device comprises detection means for detecting heater voltage across the heater. The degradation determination device further comprises degradation determination means for determining whether the heater is degraded in accordance with: at least one of the heater voltage and a diagnosis value, which changes according to the heater voltage; and power-supply voltage of the power source.

According to another aspect of the present invention, a degradation determination device for diagnosing a heater, which is configured to be supplied with electricity from a power source so as to heat a sensor element, which is for detecting exhaust gas emitted from an internal combustion engine, the degradation determination device comprises detection means for detecting heater voltage across the heater. The degradation determination device further comprises degradation determination means for determining whether the heater is degraded in accordance with: at least one of heater voltage across the heater and a diagnosis value, which changes according to the heater voltage; and a driving state of an electric device, which is supplied with electricity from the power source.

According to another aspect of the present invention, a degradation determination device for diagnosing a heater, which is configured to be supplied with electricity from a power source so as to heat a sensor element, which is for detecting exhaust gas emitted from an internal combustion engine, the degradation determination device comprises detection means for detecting heater voltage across the heater. The degradation determination device further comprises degradation determination means for determining the heater to be degraded in response to increase in one of heater voltage across the heater and a diagnosis value, which changes according to the heater voltage, to be greater than a threshold. The degradation determination means prohibits the determination in response to power-supply voltage of the power source, which becomes smaller than a predetermined minimum threshold.

According to another aspect of the present invention, a method for diagnosing a heater, which is configured to be supplied with electricity from a power source so as to heat a sensor element, which is for detecting exhaust gas emitted from an internal combustion engine, the method comprises detecting heater voltage across the heater. The method further comprises determining whether the heater is degraded in accordance with: at least one of the heater voltage and a diagnosis value, which changes according to the heater voltage; and at least one of power-supply voltage of the power source and a driving state of an electric device, which is supplied with electricity from the power source.

According to another aspect of the present invention, a method for diagnosing a heater, which is configured to be supplied with electricity from a power source so as to heat a sensor element, which is for detecting exhaust gas emitted from an internal combustion engine, the method comprises detecting heater voltage across the heater. The method further comprises determining the heater to be degraded in response to increase in one of heater voltage across the heater and a diagnosis value, which changes according to the heater voltage, to be greater than a threshold. The method further comprises prohibiting the determination in response to power-supply voltage of the power source, which becomes smaller than a predetermined minimum threshold.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

First Embodiment

Figure 1:
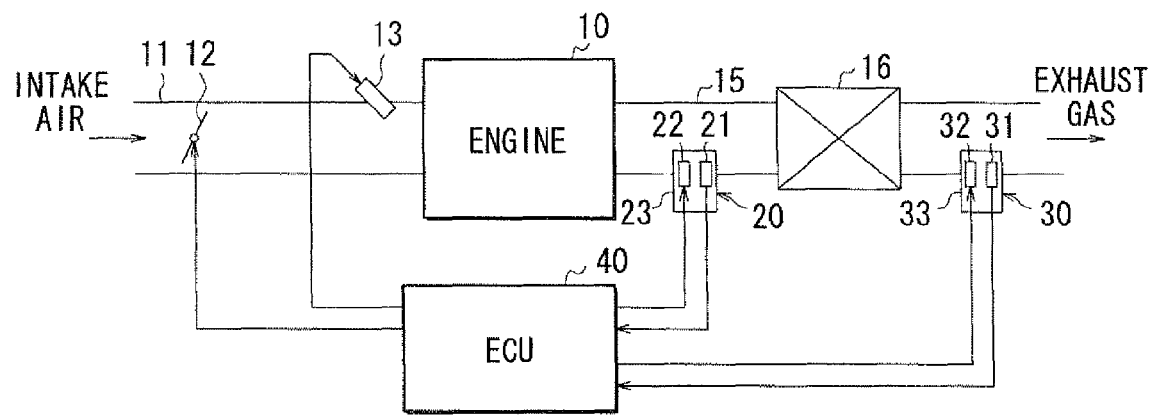
FIG. 1 is a schematic diagram view showing an engine control system according to a first embodiment.

FIG. 1 is a diagram showing a control system for an internal combustion engine 10 of a vehicle. The engine 10 is a gasoline engine such as a multi-cylinder four-stroke engine. An intake pipe 11 is provided with the throttle valve 12 for controlling an amount of intake air. An injector 13 is provided at a location around an intake port of the engine. The injector 13 is located at the downstream of the throttle valve 12 for injecting fuel. The injector 13 injects fuel to form air-fuel mixture with air, and the air-fuel mixture is burned in a combustion chamber of the engine. An exhaust pipe 15 therethrough discharges exhaust gas. A catalyst device 16 (exhaust-gas-purification device) is provided to the exhaust pipe 15 for purifying exhaust gas. The catalyst device 16 includes a three-way catalyst for oxidizing carbon monoxide (CO) and hydrocarbon (HC) and for deoxidizing nitrogen oxide (NOx), thereby purifying the components of exhaust gas.

An air-fuel sensor (A/F sensor) 20 is provided at the upstream of the catalyst device 16 in the flow direction of exhaust gas for detecting a concentration of oxygen in exhaust gas. An oxygen sensor (O2 sensor) 30 is provided at the downstream of the catalyst device 16 in the flow direction of exhaust gas for detecting a concentration (oxygen concentration) of oxygen in exhaust gas. The A/F sensor 20 is used for feedback-controlling an actual air-fuel ratio at a target air-fuel ratio (theoretical air fuel ratio) by manipulating an amount of fuel injected from the injector 13. So as to maintain efficiency of purification of the catalyst device 16, an amount of oxygen occluded in the catalyst device 16 needs to be maintained at a proper amount. According to the present embodiment, the O2 sensor 30 detects an excess air ratio λ of exhaust gas at the downstream of the catalyst device 16, and thereby the target air-fuel ratio is corrected such that an amount (oxygen occlusion amount) of oxygen occluded in the catalyst device 16 is controlled at a proper amount. Both the A/F sensor 20 and the O2 sensor 30 respectively include sensor elements 21, 31 for detecting the oxygen concentration, electric heaters 22, 32 for heating the sensor elements 21, 31, and housings 23, 33 for accommodating the sensor elements 21, 31 and the heaters 22, 32. The O2 sensor 30 is equivalent to a gas sensor, and the electric heater 22 of the A/F sensor 20 is equivalent to an electric device. The O2 sensor element 31 of the O2 sensor 30 outputs a signal of 0.9V when the excess air ratio λ is greater than 1.0, and outputs a signal of 0V when the excess air ratio λ is less than or equal to 1.0, for example. That is, the O2 sensor elements 31 detects two values including one value, which indicates the air ratio λ greater than 1, and the other value, which indicates the air ratio λ less than or equal to 1. The A/F sensor element 21 of the A/F sensor 20 outputs a signal substantially proportional to the excess air ratio λ, and therefore capable of detecting the excess air ratio λ, which is out of a range around 1.0.

The heaters 22, 32 are provided for heating to activate the sensor elements 21, 31. In particular, the heaters 22, 32 are used at the time of a starting operation of the engine 10, and thereby quickly activating the sensor elements 21, 31. After the sensor elements 21, 31 are activated, electricity supplied to the heaters 22 and 32 is, for example, duty-controlled so as to maintain temperature of the sensor elements 21, 31 at constant temperature. The A/F sensor 20 has activation temperature such as 750° C. The O2 sensor 30 has activation temperature such as 300° C. The activation temperature of the A/F sensor 20 is higher than the activation temperature of the O2 sensor 30. An A/F heater 22 of the A/F sensor 20 is larger in capacity than an O2 heater 32 of the O2 sensor 30. After the starting operation of the engine 10, the A/F sensor 20 is activated further quickly than the O2 sensor 30.

Figure 2:
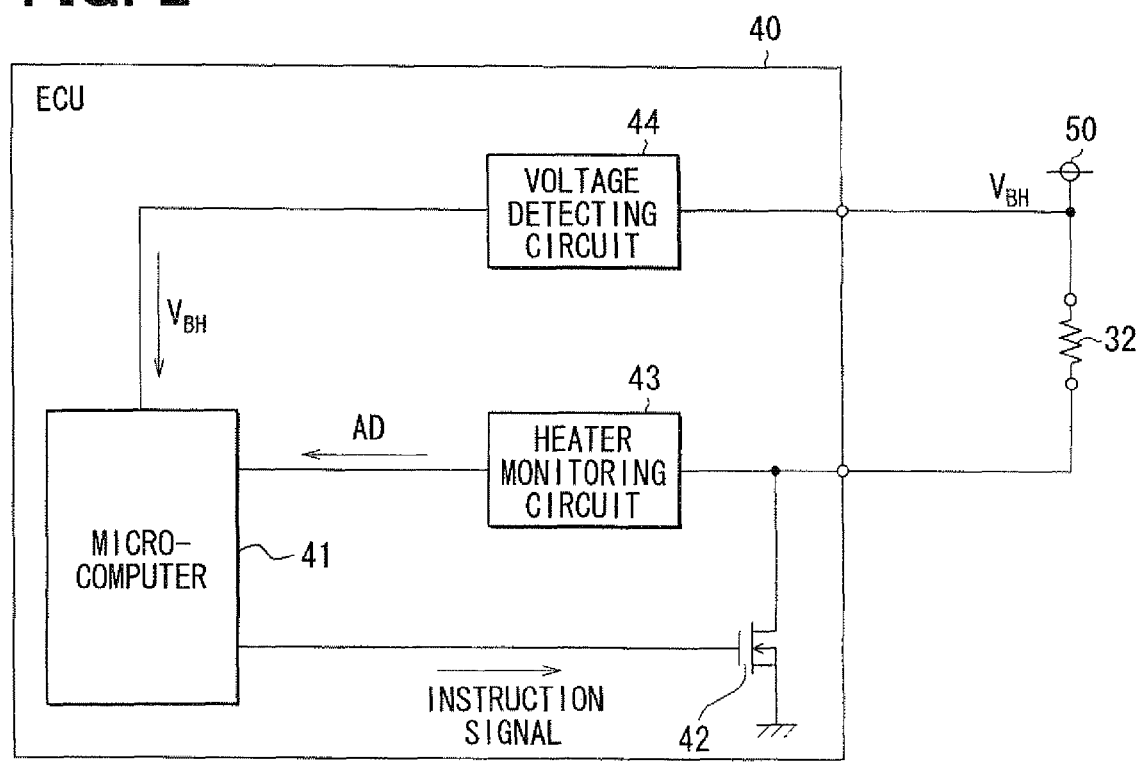
FIG. 2 is a functional block diagram showing an ECU depicted in FIG. 1.

As shown in FIG. 2, an electronic control unit (ECU) 40 is mainly constructed of a microcomputer 41 including a CPU, a ROM, a RAM, and the like. The ECU 40 executes various kinds of control programs stored in the ROM, and thereby arbitrary performing various kinds of controls of the engine 10 according to an engine operation state of the engine. Specifically, the ECU 40 manipulates a throttle position (opening) of a throttle valve 12 so as to control an amount of intake air at a demanded amount according to a position an accelerator pedal manipulated by an occupant of the vehicle. In addition, the ECU 40 performs an injection quantity control so as to control an air fuel ratio of air-fuel mixture at a target air-fuel ratio such as a theoretical air fuel ratio by manipulating an amount (fuel injection quantity) of fuel injected from the injector 13. The ECU 40 inputs output signals (detection signals) of the A/F sensor element 21 and the O2 sensor element 31. The ECU 40 feedback-controls the actual air-fuel ratio at the target air-fuel ratio by manipulating the fuel injection quantity based on the detection signal of the A/F sensor element 21. The ECU 40 calculates the actual air-Fuel ratio based on the detection signal of the A/F sensor 20. In the present processing of the actual air-fuel ratio, the ECU 40 corrects the target air-fuel ratio based on the detection signal of the O2 sensor 30 such that the oxygen occlusion amount of the catalyst device 16 becomes a proper amount. The ECU 40 performs a duty control of electricity supplied to the A/F heater 22 and the O2 heater 32 so as to maintain temperature of the sensor elements 21, 31 at constant temperature. Thereby, the A/F sensor 20 and the O2 sensor 30 are maintained at a predetermined active state.

As follows, the duty control of the O2 heater 32 will be described in detail. An impedance circuit (not shown) is provided for detecting temperature of the O2 sensor element 31. The ECU 40 calculates the duty ratio related to the electricity supplied to the O2 heater 32 such that temperature of the O2 sensor element 31, which is detected by the impedance circuit, is controlled at predetermined target temperature such as 300° C. Thus, the ECU 40 performs the duty control of the O2 heater 32 based on the calculated duty ratio. More specifically, the microcomputer 41 outputs a drive instruction signal to a switching circuit 42 to supply electricity at the calculated duty ratio. The switching circuit 42 includes a transistor, for example. The switching circuit 42 operates according to the drive instruction signal, and thereby performing an ON-OFF switching control of electricity supplied from a battery 50 to the O2 heater 32 at the calculated duty ratio. Similarly to the O2 heater 32, a switching circuit performs a duty control of electricity supplied to the A/F heater 22 such that temperature of the A/F sensor 20 is controlled at predetermined target temperature such as 750° C.

Figure 3:
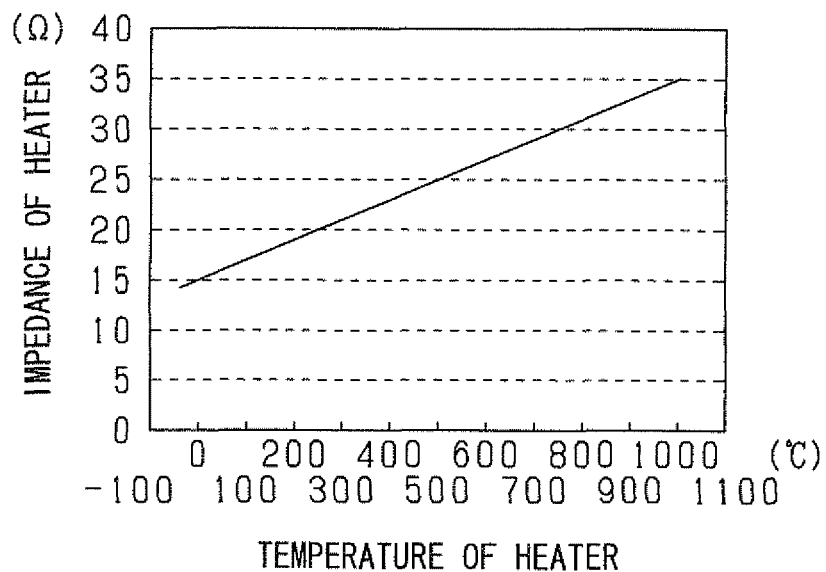
FIG. 3 is a graph showing a relationship between temperature and impedance of the heater shown in FIG. 1.

FIG. 3 is a graph showing a relationship between temperature of the O2 heater 32 and impedance of the O2 heater 32. Impedance of the O2 heater 32 increases with increase in temperature. Alternatively, impedance of the O2 heater 32 also increases with progress of degradation of the heater 32. As the impedance of the O2 heater 32 increases due to progress of degradation, the O2 heater 32 becomes hard to therethrough conduct electricity. Therefore, even when predetermined voltage is applied to the O2 heater 32, temperature of the O2 heater 32 may not increase to the predetermined temperature when the O2 heater 32 is degraded. Consequently, activation of the O2 sensor element 31 may become slow, or the activation temperature of the O2 sensor element 31 such as 300° C. may not be maintained. Thus, the actual air-fuel ratio cannot be controlled at the target air-fuel ratio with high accuracy. Furthermore, the catalyst device 16 cannot sufficiently purify exhaust gas, and consequently a purification rate of exhaust gas may decrease. Therefore, in the present embodiment, the microcomputer 41 determines existence of degradation caused in the O2 heater 32. Hereinafter, a determination processing of degradation caused in the heater 32 will be described. As shown in FIG. 2, the ECU 40 includes a heater monitoring circuit 43 and a power-supply-voltage detecting circuit 44. The ECU 40 functions as a degradation determination device. The heater monitoring circuit 43 inputs an analog signal of voltage between both wiring ends of the O2 heater 32, i.e., voltage across the O2 heater 32. The heater monitoring circuit 43 performs an A/D conversion of the analog signal of the voltage, which is in the range between 0V and 15V, to a digital signal, which is in the range between 0V and 5V. The heater monitoring circuit 43 outputs the signal, which is applied with the A/D conversion, as a monitoring voltage signal to the microcomputer 41. The heater monitoring circuit 43 may function as detection means.

The power-supply-voltage detecting circuit 44 detects power supply voltage of the battery 50 and outputs the detected power-supply voltage VBH to the microcomputer 41. A regulator (not shown) of an alternator controls an exciting current supplied to a rotor coil, and thereby the power supply voltage of the battery 50 is regulated in fluctuation. The exciting current is determined based on the power supply voltage VBH, engine speed, and the like. The monitoring voltage AD, which is detected by the heater monitoring circuit 43, decreases with the progress of degradation caused in the heater 32. The microcomputer 41 determines whether the heater 32 is degraded based on a determination whether the monitoring voltage AD decreases to be less than a threshold (degradation determination voltage) VTH. The monitoring voltage AD changes with variation in power supply voltage of the battery 50. Therefore, the threshold VTH is set to be high as the power supply voltage VBH becomes high. The monitoring voltage AD may be equivalent to a diagnosis value.

Figure 4:
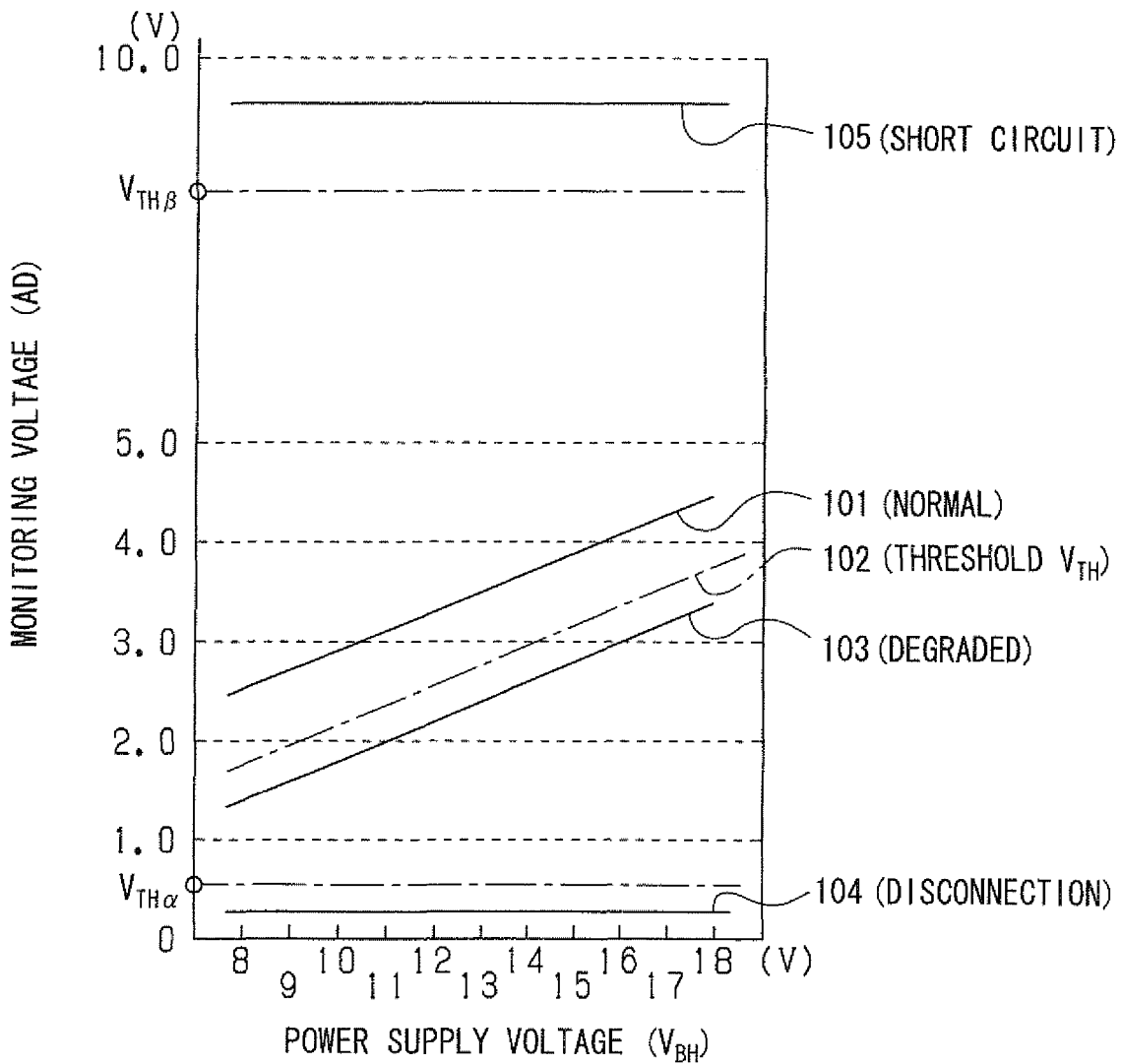
FIG. 4 is a graph for explaining a threshold related to a degradation determination processing according to the first embodiment.

In FIG. 4, a solid line 101 indicates change in monitoring voltage AD with respect to the power supply voltage VBH in a normal condition when the heater 32 is not degraded. A dashed dotted line 102 indicates the threshold VTH, which is set in accordance with the power supply voltage VBH. A solid line 103 indicates change in monitoring voltage AD with respect to the power supply voltage VBH when the monitoring voltage AD is lower than the threshold VTH due to progress of degradation of the heater 32 in a degraded condition. As shown in FIG. 4, since the monitoring voltage AD linearly changes with change in power supply voltage VBH, the threshold VTH is linearly changed according to change in power supply voltage VBH. The monitoring voltage AD shown in FIG. 4 is a value under an assumption that the impedance (heater temperature shown in FIG. 3) of the heater 32 is the maximum value of the heater impedance in a normal condition, in which the heater 32 is not degraded. The maximum value of the heater impedance in the normal condition, in which the heater 32 is not degraded, is assumed to be the impedance of 35Ω at the temperature of 1000° C. shown in FIG. 3.

In addition to the degradation determination, the microcomputer 41 performs a disconnection determination and a short-circuit determination described as follows. In the disconnection determination, it is determined whether a disconnection arises in a supply path, through which electric power is supplied to the heater 32 or a component of the heater 32. A solid line 104 in FIG. 4 indicates the monitoring voltage AD when such a disconnection arises. The monitoring voltage AD at the time of the disconnection depicted by the solid line 104 is significantly lower than the monitoring voltage AD at the time of the degradation depicted by the solid line 103. Therefore, a threshold VTHα for the disconnection determination is set separately from the threshold VTH for the degradation determination, and it is determined that disconnection arises when the monitoring voltage AD is less than the threshold VTHα. In the short-circuit determination, it is determined whether a short circuit arises in a supply path, through which electric power is supplied to the heater 32. A solid line 105 in FIG. 4 indicates the monitoring voltage AD when such a short circuit arises. The monitoring voltage AD at the time of the short circuit depicted by the solid line 105 is significantly higher than the monitoring voltage AD at the time of the degradation depicted by the solid line 103. Therefore, a threshold VTHβ for the short-circuit determination is set separately from the threshold VTH for the degradation determination, and it is determined that short circuit arises when the monitoring voltage AD is higher than the threshold VTHβ.

As depicted by the solid lines 104, 105 in FIG. 4, the monitoring voltage AD at the time of disconnection and the monitoring voltage AD at the time of short circuit are substantially constant values, regardless of the power supply voltage VBH. In view of the monitoring voltage AD at the time of disconnection and short circuit, the threshold VTHα for the disconnection determination and the threshold VTHβ for the short-circuit determination are not variables, which are set according to the power supply voltage VBH, but constant values fixed regardless of the power supply voltage VBH.

Figure 5:
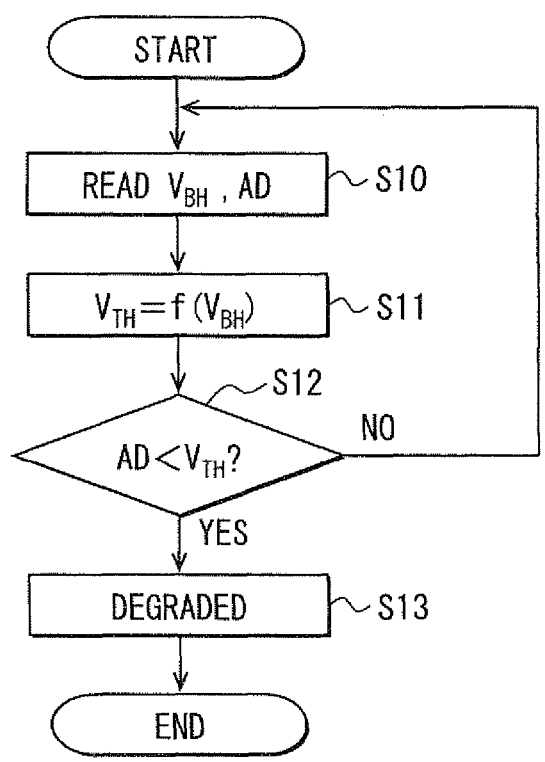
FIG. 5 is a flow chart showing a procedure of the degradation determination processing according to the first embodiment.

FIG. 5 is a flow chart showing a processing of the degradation determination executed by the microcomputer (degradation determination means) 41. The present processing of the degradation determination is repeatedly executed during a period in which an ignition switch of the vehicle is activated. First, at step S10, the power supply voltage VBH, which is detected by the power-supply-voltage detecting circuit 44, is read, and the monitoring voltage AD, which changes according to the voltage between the wiring ends of the heater 32, is read. The voltage (heater voltage) between the wiring ends of the heater 32, i.e., voltage dropped through the heater 32 is detected by the heater monitoring circuit 43. At subsequent step S11 (threshold setting means), the threshold VTH depicted by the dashed dotted line 102 in FIG. 4 is calculated as the degradation determination voltage based on the monitoring voltage AD, which is read at step S10. The threshold VTH is calculated by using a formula of VTH=f (VBH), in which the function f is a linear function of a variable of the power supply voltage VBH. The inclination of the threshold VTH depicted by the dashed dotted line 102 is set to be substantially the same as the inclination of the solid lines 101, 103, which are beforehand obtained by an experiment or the like. At subsequent step S12 (determination means), it is determined whether the monitoring voltage AD, which is read at step S10, is less than the threshold VTH, which is calculated at step S11. When the equation of AD<VTH is determined not to be satisfied, the heater 32 is considered not to be in a degradation condition, in which degradation arises in the heater 32. In this case, step S12 makes a negative determination, and thereby the processing returns to step S10. Alternatively, when the equation of AD<VTH is determined to be satisfied, step S12 makes a positive determination, and thereby the processing proceeds to step S13, in which the heater 32 is determined to be in the degradation condition. In this case, a diagnostic signal, which indicates the degradation of the heater 32, is outputted to an external device.

As described above, according to the present embodiment, the heater 32 is determined to be in the degradation condition when the monitoring voltage AD, which changes according to the voltage between both wiring ends of the heater 32, is less than the threshold VTH. As the power supply voltage VBH of the battery 50, which supplies electricity to the heater 32, decreases, the threshold VTH for the degradation determination is set low. Therefore, the threshold VTH can be regularly set to be slightly lower than the monitoring voltage AD in the normal condition. Therefore, degradation of the heater can be determined with sufficient accuracy.

Second Embodiment

In the first embodiment, the threshold VTH for the degradation determination of the heater 32 is set according to the power supply voltage VBH. According to the present second embodiment, as depicted by the multiple dashed dotted lines VTH1, VTH2, VTH3 in FIG. 6, thresholds are determined according to a driving state of an electric device other than the heater 32. The electric device is actuated by being supplied with electricity from the battery 50. The electric device may be the heater 22 of the A/F sensor 20, an actuator (not shown) provided to the injector 13 for opening and closing the nozzle hole, for example. When the electric device is actuated, electric load applied to the battery 50 increases, and thereby the power supply voltage VBH decreases. That is, even when the heater 32 is similarly degraded, as a driving rate of the electric device, which relates to the electric load, becomes high, the monitoring voltage AD decreases. Therefore, in the present embodiment, as the driving rate of the electric device becomes higher, the threshold is set lower. For example, when all the predetermined multiple electric devices are not actuated, the degradation determination of the heater is performed by using the threshold VTH1 in FIG. 6. Alternatively, when one of the multiple electric devices is actuated, the degradation determination is performed by using the threshold VTH2, which is set lower than the threshold VTH1. Alternatively, when two of the multiple electric devices are actuated, the degradation determination is performed by using the threshold VTH3, which is set lower than the threshold VTH2. Alternatively, as the driving rate of a predetermined electric device such as the A/F heater 22 becomes high, the threshold may be decreased through three stages by setting at one of the thresholds VTH1, VTH2, VTH3 in series. The driving rate relates to the duty ratio of the predetermined electric device. The thresholds VTH1, VTH2, VTH3 for the degradation determination are not variables, which are set according to the power supply voltage VBH, but constant values fixed regardless of the power supply voltage VBH.

Figure 6:
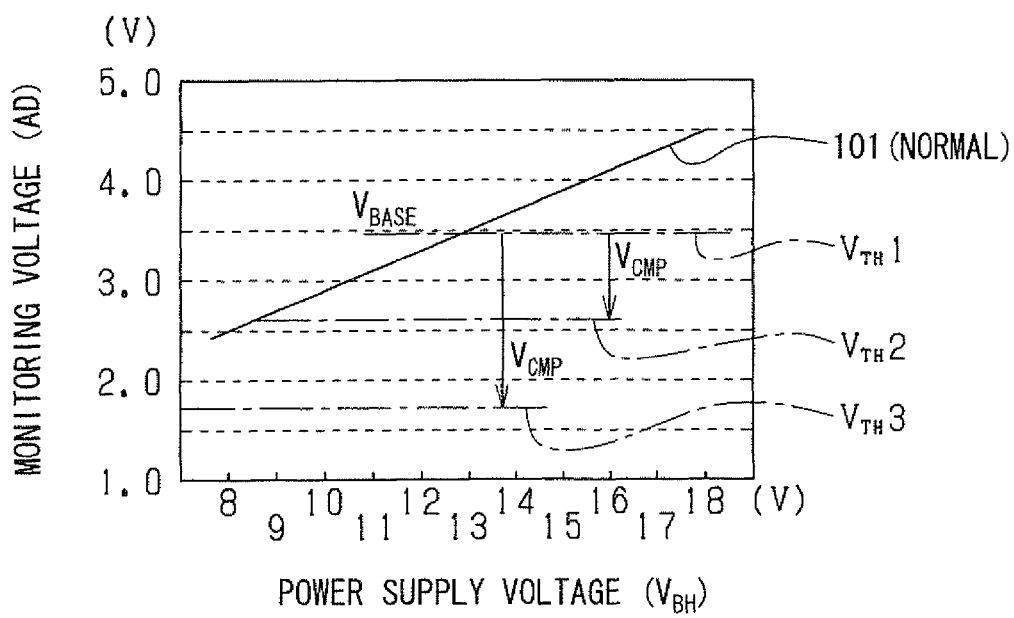
FIG. 6 is a graph for explaining thresholds related to a degradation determination processing according to a second embodiment.
Figure 7:
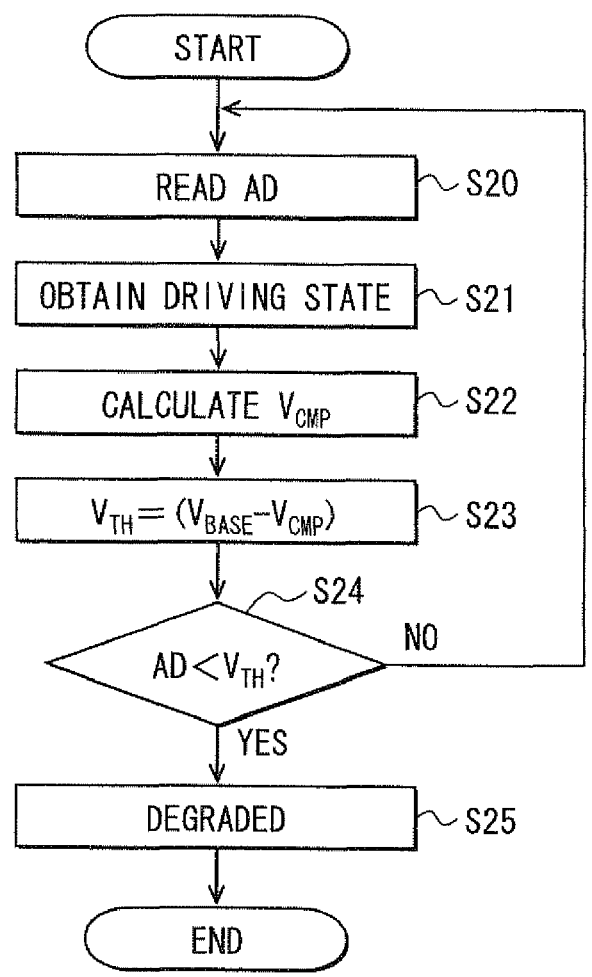
FIG. 7 is a flow chart showing a procedure of the degradation determination processing according to the second embodiment.

FIG. 7 is a flow chart showing a processing of the degradation determination according to the present embodiment executed by the microcomputer (degradation determination means) 41. The present processing of the degradation determination is repeatedly executed during a period in which the ignition switch of the vehicle is activated. First, at step S20, the monitoring voltage AD, which is detected by the heater monitoring circuit 43, is read. The monitoring voltage AD changes according to the voltage between both wiring ends of the heater 32. At subsequent step S21, an operation state of the A/F heater 22 is obtained. The operation state may be related to the duty ratio, a determination result whether the A/F heater 22 is operated, and the like, for example. At subsequent step S22 (threshold setting means), a correction voltage VCMP is calculated according to the operation state, which is obtained at step S21. Specifically, the correction voltage VCMP is set proportionally large as the drive duty ratio of the A/F heater 22 increases. Alternatively, when the A/F heater 22 is in operation, the correction voltage VCMP is set greater than the correction voltage VCMP when the A/F heater 22 is out of operation. At subsequent step S23 (reference threshold setting means, reference threshold correction means), the threshold VTH, which is for the degradation determination of the O2 heater 32, is corrected by using the correction voltage VCMP calculated at step S22. Specifically, the reference value VBASE (reference threshold) is predetermined as depicted by the dashed dotted line VTH1 in FIG. 6, and the threshold VTH is calculated by subtracting the correction voltage VCMP from the reference value VBASE. Consequently, the threshold (reference value VBASE) depicted by the dashed dotted line VTH1 in FIG. 6 is corrected to the thresholds VTH2, VTH3. At subsequent step S24 (determination means), it is determined whether the monitoring voltage AD, which is read at step S20, is less than the threshold VTH, which is calculated at step S23. When the equation of AD<VTH is determined not to be satisfied, the O2 heater 32 is considered not to be in the degradation condition. In this case, step S24 makes a negative determination, and thereby the processing returns to step S20. Alternatively, when the equation of AD<VTH is determined to be satisfied, step S24 makes a positive determination, and thereby the processing proceeds to step S25, in which the heater 32 is determined to be in the degradation condition. In this case, a diagnostic signal, which indicates the degradation of the heater 32, is outputted to an external device.

As described above, according to the present embodiment, the O2 heater 32 is determined to be in the degradation condition when the monitoring voltage AD, which changes according to the voltage between both wiring ends of the O2 heater 32, is less than the threshold VTH. As the electric load of the electric device such as the A/F heater 22, which has a correlation with change in power supply voltage VBH, becomes large, the threshold VTH for the degradation determination is set low. Therefore, the threshold VTH can be regularly set to be slightly lower than the monitoring voltage AD in the normal condition. Therefore, degradation of the heater can be determined with sufficient accuracy. The power supply voltage VBH may cause instantaneous decrease in a period, in which the electric device such as the A/F heater 22 is actuated. In view of the present condition, in the present embodiment, the threshold VTH is corrected to be lower in the period in which the electric device is actuated. Therefore, erroneous determination, which is caused by the instantaneous decrease in power supply voltage VBH, can be reduced. Furthermore, according to the present embodiment, the power supply voltage VBH of the battery 50 is not used in the calculation of the correction voltage VCMP, and therefore detection of the power supply voltage VBH can be omitted. Therefore, the structure of the ECU 40, which also functions as the degradation determination device, can be simplified by omitting the power-supply-voltage detecting circuit 44, for example.

The electric device other than the heater 32 may be the injector 13 and/or an igniter. When the injector 13 and/or the igniter are supplied with electricity and actuated, the power supply voltage instantaneously changes. More specifically, electricity is supply to the injector 13 and/or the igniter in one burning cycle, and therefore the power supply voltage may quickly decrease at a specific time point in one burning cycle. Accordingly, the power supply voltage in the deterioration determination is difficult to be correctly obtained in the burning cycles when the injector 13 and/or the igniter are supplied with electricity. Thus, an erroneous determination of the heater deterioration may arise. In view of the present condition, the threshold VTH may be also corrected to be lower in the period in which the electric device such as the injector 13 and/or an igniter are actuated. Thereby, erroneous determination, which is caused by the instantaneous decrease in power supply voltage VBH, can be reduced. The threshold may be corrected and decreased, as the number of the electric devices, which are supplied with electricity, increases, and thereby electric load caused by the electric devices becomes large.

Third Embodiment

Figure 8:
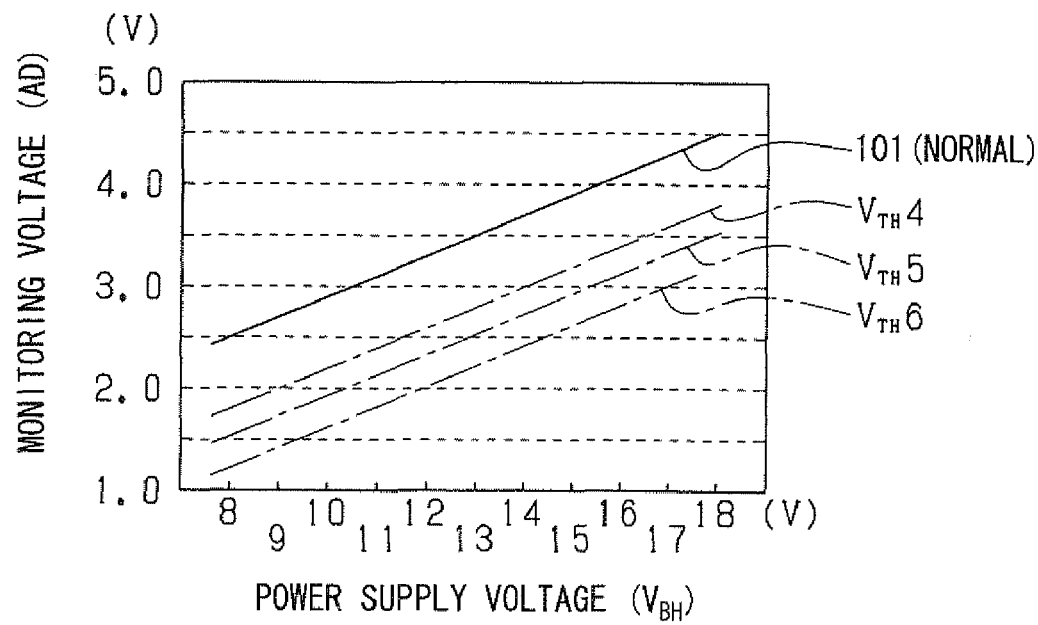
FIG. 8 is a graph for explaining thresholds related to a degradation determination processing according to a third embodiment.

In the present third embodiment, the threshold VTH for the degradation determination of the heater 32 is set according to the power supply voltage VBH similarly to the embodiment. In addition, the threshold VTH is set according to the driving state of the electric device such as the A/F heater 22 similarly to the second embodiment. As depicted by the dashed dotted lines VTH4, VTH5, VTH6 in FIG. 8, the thresholds for the degradation determination are set high as the power supply voltage VBH becomes high. As the electric load of the electric device such as the A/F heater 22 becomes high, the threshold is decreased by setting at one of the reference thresholds VTH4, VTH5, VTH6 in order. According to the present operation, degradation of the heater can be determined with higher accuracy compared with the first embodiment.

Fourth Embodiment

The power supply voltage VBH has a normal range such as a range between 9.5V and 15V, and the power supply voltage VBH rarely decrease to be lower than the minimum value such as 9.5V. Therefore, in the present embodiment, when the power supply voltage VBH is greater than the minimum value of the normal range, which is depicted by the dashed dotted line Vmin in FIG. 9, the degradation determination of the heater 32 is performed. Alternatively, when the power supply voltage VBH is less than or equal to the minimum value Vmin of the normal range, the degradation determination of the heater 32 is prohibited. The microcomputer 41, which also functions as the degradation determination means, determines whether the monitoring voltage AD detected by the heater monitoring circuit 43 decreases to be less than a predetermined threshold VTH7 depicted in FIG. 9. When the monitoring voltage AD is less than the threshold VTH7 (AD<VTH7), the heater 32 is determined to be in the degradation condition. The threshold VTH7 is not set according to the power supply voltage VBH. That is, the threshold VTH7 is not a variable but a constant value fixed regardless of the power supply voltage VBH.

Figure 10:
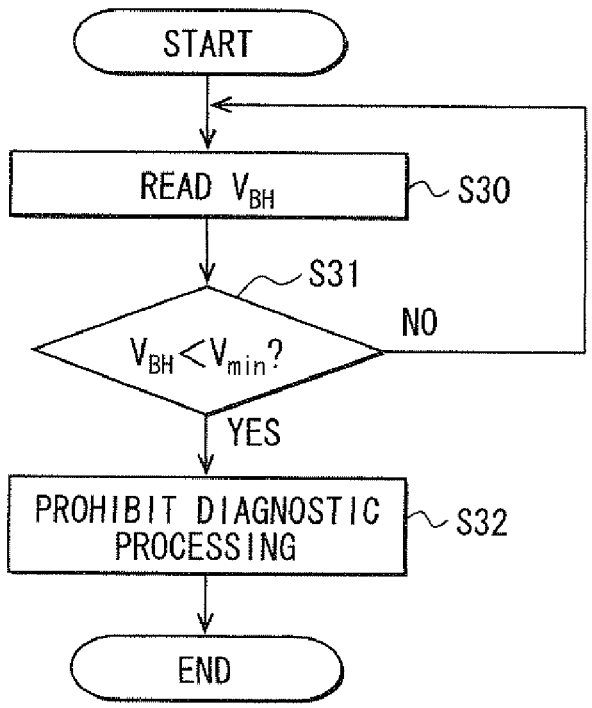
FIG. 10 is a flow chart showing a procedure of the degradation determination processing according to the fourth embodiment.

The microcomputer 41 repeatedly performs the processing shown in FIG. 10 separately from the degradation determination (degradation diagnostic processing). First, at step S30, the power supply voltage VBH, which is detected by the power-supply-voltage detecting circuit 44, is read. At subsequent step S31, it is determined whether the power supply voltage VBH, which is read at step S30, is less than a predetermined degradation diagnostic minimum voltage (minimum value Vmin). When the power supply voltage VBH is determined to be greater than or equal to the predetermined degradation diagnostic minimum voltage Vmin (VBH≧Vmin), a negative determination is made at step S31. In this case, the processing returns to step S30 and continues the degradation diagnostic processing. Alternatively, when the power supply voltage VBH is determined to be less than the predetermined degradation diagnostic minimum voltage Vmin (VBH<Vmin), a positive determination is made at step S31. In this case, the processing proceeds to step S32 and prohibits the degradation diagnostic processing.

Figure 9:
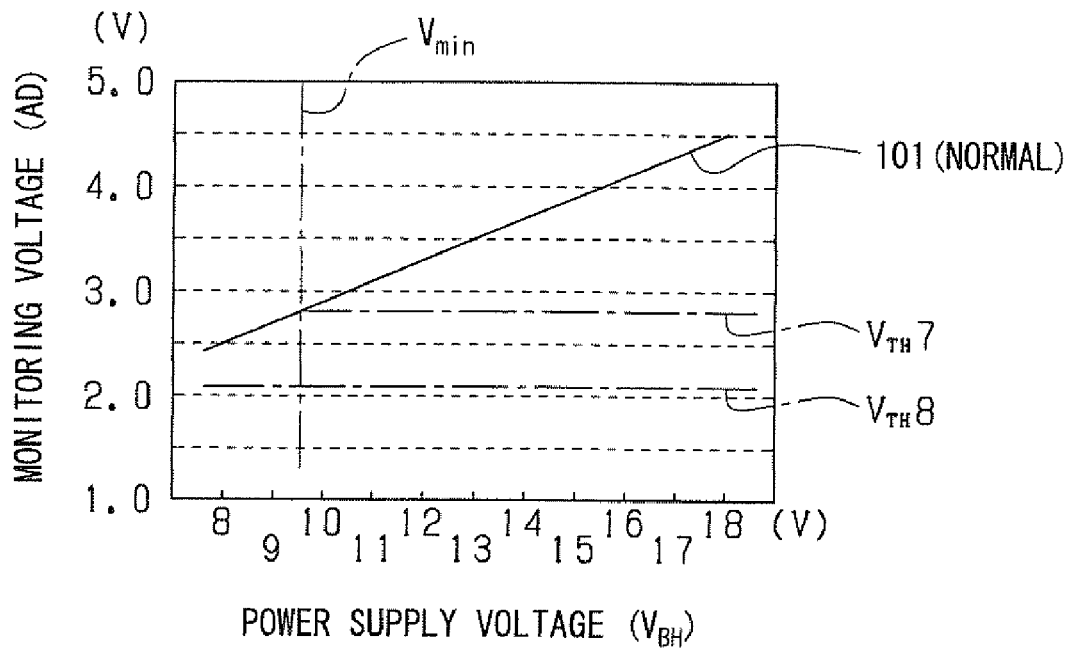
FIG. 9 is a graph for explaining thresholds related to a degradation determination processing according to a fourth embodiment.

According to the present embodiment, when the power supply voltage VBH is greater than the minimum value Vmin, the threshold VTH7 of the degradation determination is set to be slightly lower than the minimum value of the monitoring voltage AD, which is possibly low when the heater is not in the degraded condition. For comparison, as shown in FIG. 9, a threshold VTH8 is set for the degradation diagnostic processing when the power supply voltage VBH is less than the minimum Vmin. Compared with the threshold VTH8, the threshold VTH7 can be set in the vicinity of the monitoring voltage AD in the normal condition, in which the heater 32 is determined to be in the degradation condition. Therefore, degradation of the heater can be determined with sufficient accuracy.

Other Embodiment

The embodiments may be modified as follows. The present invention is not limited to the above embodiment. The features of the embodiments may be partially or entirely combined arbitrarily.

In the first embodiment, the threshold VTH is set according to the power supply voltage VBH. Alternatively, the threshold VTH may be a predetermined fixed value, and the signal of the monitoring voltage AD, which is outputted from the heater monitoring circuit 43, may be corrected according to the power supply voltage VBH. In this case, as the power supply voltage VBH becomes low, the monitoring voltage AD may be corrected to be high.

In the fourth embodiment, the degradation determination of the heater is performed subsequent to the determination whether the monitoring voltage AD decreases to be less than the threshold VTH7. In the degradation determination, the threshold VTH7 is set at the constant value regardless of the power supply voltage VBH.

Alternatively, by combining one of the first to third embodiments with the fourth embodiment, the threshold VTH7 may be set as a variable.

According to the embodiments, the degradation determination is applied to the heater 32 for the O2 sensor 30. However, the present invention is not limited to the application to the heater for an O2 sensor. For example, the degradation determination may be performed for a heater, which is provided to the A/F sensor 20, a NOx sensor, which detects a concentration of nitrogen oxide (NOx) of exhaust gas, an HC sensor, which detects a concentration of hydrocarbon (HC) of exhaust gas, and the like.

The microcomputer 41 may directly obtain the heater voltage and/or the monitoring voltage AD. In this case, the heater monitoring circuit 43 may be omitted. The above processings such as calculations and determinations are not limited being executed by the ECU 40 and the microcomputer 41. The control unit may have various structures including the ECU 40 and the microcomputer 41 shown as an example.

The above processings such as calculations and determinations may be performed by any one or any combinations of software, an electric circuit, a mechanical device, and the like. The software may be stored in a storage medium, and may be transmitted via a transmission device such as a network device. The electric circuit may be an integrated circuit, and may be a discrete circuit such as a hardware logic configured with electric or electronic elements or the like. The elements producing the above processings may be discrete elements and may be partially or entirely integrated.

The above embodiments are not limited to an analog circuitry including analog signal handling equipments configured to perform the processings such as the comparison, the amplification, and other operations by using analog quantities. For example, at least part of the signals in the circuit structures in the above embodiments may be converted to digital signals, and substantially the same processings such as the comparison, the amplification, and other operations may be performed using the converted digital signals by employing a microcomputer, a programmable logic circuit, and the like.

It should be appreciated that while the processes of the embodiments of the present invention have been described herein as including a specific sequence of steps, further alternative embodiments including various other sequences of these steps and/or additional steps not disclosed herein are intended to be within the steps of the present invention.

Various modifications and alternations may be diversely made to the above embodiments without departing from the spirit of the present invention.

What is claimed is:

1. A degradation determination device for diagnosing a heater, which is configured to be supplied with electricity from a power source so as to heat a sensor element, which is for detecting exhaust gas emitted from an internal combustion engine, the degradation determination device comprising:
   detection means for detecting heater voltage across the heater; and
   degradation determination means for determining whether the heater is degraded in accordance with:
      at least one of the heater voltage and a diagnosis value, which changes according to the heater voltage;
      power-supply voltage of the power source; and
      a driving state of an electric device, which is a different component from the heater and supplied with electricity from the power source.

2. The degradation determination device according to claim 1,
   wherein the degradation determination means includes:
   determination means for determining whether the heater is degraded by comparing the one of the heater voltage and the diagnosis value with a threshold; and
   threshold setting means for setting the threshold according to the power-supply voltage.

3. The degradation determination device according to claim 1,
   wherein the degradation determination means includes:
   determination means for determining whether the heater is degraded by comparing the one of the heater voltage and the diagnosis value with a threshold; and
   threshold setting means for setting the threshold according to the power-supply voltage and the driving state of the electric device.

4. The degradation determination device according to claim 3,
   wherein the threshold setting means includes:
   reference threshold setting means for setting a reference threshold, which changes substantially linearly according to the power-supply voltage; and
   reference threshold correction means for setting the threshold by correcting the reference threshold such that the heater is hard to be determined to be degraded as electric load caused by the electric device becomes large.

5. The degradation determination device according to claim 1, wherein the electric device is at least one of a heater of an A/F sensor, an injector, and an igniter.

6. The degradation determination device according to claim 5, further comprising:
   driving-state detection means for detecting the driving state of the electric device, wherein
   the degradation determination means is configured to determine whether the heater is degraded in accordance with:
      the at least one of the heater voltage and the diagnosis value;
      the power-supply voltage; and
      the driving state detected by the driving-state detection means.

7. The degradation determination device according to claim 6, wherein the driving state is energization and de-energization of the electric device.

8. A degradation determination device for diagnosing a heater, which is configured to be supplied with electricity from a power source so as to heat a sensor element, which is for detecting exhaust gas emitted from an internal combustion engine, the degradation determination device comprising:
- detection means for detecting heater voltage across the heater; and
- degradation determination means for determining whether the heater is degraded in accordance with:
  - at least one of the heater voltage and a diagnosis value, which changes according to the heater voltage; and
  - a driving state of an electric device, which is supplied with electricity from the power source,
- wherein the degradation determination means includes:
- determination means for determining the heater to be degraded in response to the one of the heater voltage and the diagnosis value, which becomes greater than a threshold; and
- threshold setting means for setting the threshold according to the power-supply voltage and the driving state of the electric device,
- wherein the threshold setting means sets the threshold by correcting a predetermined reference threshold such that the heater is hard to be determined to be degraded as electric load caused by the electric device becomes large.

9. A degradation determination device for diagnosing a heater, which is configured to be supplied with electricity from a power source so as to heat a sensor element, which is for detecting exhaust gas emitted from an internal combustion engine, the degradation determination device comprising:
- detection means for detecting heater voltage across the heater; and
- degradation determination means for determining the heater to be degraded in response to increase in one of heater voltage across the heater and a diagnosis value, which changes according to the heater voltage, to be greater than a threshold,
- wherein the degradation determination means prohibits the determination in response to power-supply voltage of the power source, which becomes smaller than a predetermined minimum threshold.

10. A method for diagnosing a heater, which is configured to be supplied with electricity from a power source so as to heat a sensor element, which is for detecting exhaust gas emitted from an internal combustion engine, the method comprising:
- detecting heater voltage across the heater; and
- determining whether the heater is degraded in accordance with:
  - at least one of the heater voltage and a diagnosis value, which changes according to the heater voltage; and
  - at least one of power-supply voltage of the power source and a driving state of an electric device, which is supplied with electricity from the power source;
- determining the heater to be degraded in response to the one of the heater voltage and the diagnosis value, which becomes greater than a threshold; and
- setting the threshold according to the power-supply voltage and the driving state of the electric device by correcting a predetermined reference threshold such that the heater is hard to be determined to be degraded as electric load caused by the electric device becomes large.

11. A method for diagnosing a heater, which is configured to be supplied with electricity from a power source so as to heat a sensor element, which is for detecting exhaust gas emitted from an internal combustion engine, the method comprising:
- detecting heater voltage across the heater;
- determining the heater to be degraded in response to increase in one of heater voltage across the heater and a diagnosis value, which changes according to the heater voltage, to be greater than a threshold; and
- prohibiting the determination in response to power-supply voltage of the power source, which becomes smaller than a predetermined minimum threshold.

12. A degradation determination device for diagnosing a heater, which is configured to be supplied with electricity from a power source so as to heat a sensor element, which is for detecting exhaust gas emitted from an internal combustion engine, the degradation determination device comprising:
- detection unit for detecting heater voltage across the heater; and
- degradation determination unit for determining whether the heater is degraded in accordance with:
  - at least one of the heater voltage and a diagnosis value, which changes according to the heater voltage;
  - power-supply voltage of the power source; and
  - a driving state of an electric device, which is supplied with electricity from the power source,
- wherein the degradation determination unit includes:
- determination unit for determining whether the heater is degraded by comparing the one of the heater voltage and the diagnosis value with a threshold; and
- threshold setting unit for setting the threshold according to the power-supply voltage and the driving state of the electric device,
- wherein the threshold setting unit includes:
- reference threshold setting unit for setting a reference threshold, which changes substantially linearly according to the power-supply voltage; and
- reference threshold correction unit for setting the threshold by correcting the reference threshold such that the heater is hard to be determined to be degraded as electric load caused by the electric device becomes large.

13. A degradation determination device for diagnosing a heater, which is configured to be supplied with electricity from a power source so as to heat a sensor element, which is for detecting exhaust gas emitted from an internal combustion engine, the degradation determination device comprising:
- detection unit for detecting heater voltage across the heater;
- driving-state detection unit for detecting energization and de-energization of an electric device being other than the heater and supplied with electricity from the power source; and
- degradation determination unit for determining whether the heater is degraded in accordance with:
  - at least one of the heater voltage and a diagnosis value, which changes according to the heater voltage;
  - power-supply voltage of the power source; and
  - the energization and de-energization of the electric device detected by the driving-state detection unit.

14. The degradation determination device according to claim 13, wherein the electric device is at least one of a heater of an A/F sensor, an injector, and an igniter.

* * * * *